United States Patent
Yang et al.

(10) Patent No.: US 9,887,247 B2
(45) Date of Patent: Feb. 6, 2018

(54) SUB-PIXEL ARRANGEMENT STRUCTURE OF ORGANIC LIGHT EMITTING DIODE DISPLAY

(71) Applicant: Novatek Microelectronics Corp., Hsinchu (TW)

(72) Inventors: Hsueh-Yen Yang, Taoyuan (TW); Feng-Ting Pai, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 44 days.

(21) Appl. No.: 14/700,167

(22) Filed: Apr. 30, 2015

(65) Prior Publication Data

US 2016/0322432 A1  Nov. 3, 2016

(51) Int. Cl.
*H01L 27/32* (2006.01)
*G09G 3/3208* (2016.01)

(52) U.S. Cl.
CPC ....... *H01L 27/3218* (2013.01); *G09G 3/3208* (2013.01); *H01L 27/3276* (2013.01)

(58) Field of Classification Search
CPC .............. G09G 3/3208; H01L 27/3218; H01L 27/3276
USPC ..................................... 257/40; 345/211–213
See application file for complete search history.

(56) References Cited

U.S. PATENT DOCUMENTS

| | | | |
|---|---|---|---|
| 2007/0057963 A1* | 3/2007 | Brown Elliott | ... G02F 1/133514 345/613 |
| 2008/0049048 A1* | 2/2008 | Credelle | .............. G09G 3/2074 345/690 |
| 2013/0113997 A1 | 5/2013 | Lee et al. | |
| 2014/0204008 A1 | 7/2014 | Chu-Ke et al. | |
| 2015/0015466 A1 | 1/2015 | Feng | |
| 2015/0200237 A1* | 7/2015 | Yim | ..................... H01L 27/3248 257/40 |
| 2016/0335948 A1* | 11/2016 | Wen | ...................... G09G 3/2085 |
| 2017/0193874 A1* | 7/2017 | Laurion | ................... G09G 3/20 |

FOREIGN PATENT DOCUMENTS

| | | |
|---|---|---|
| TW | 201430816 | 8/2014 |
| TW | 201503343 | 1/2015 |

OTHER PUBLICATIONS

"Office Action of Taiwan Counterpart Application", dated Apr. 28, 2016, p. 1-p. 12.

* cited by examiner

*Primary Examiner* — Tony Davis
(74) *Attorney, Agent, or Firm* — JCIPRNET

(57) ABSTRACT

A sub-pixel arrangement structure of an organic light emitting diode display including a plurality of sub-pixels is provided. The plurality of sub-pixels are arranged in a first direction and a second direction to form a sub-pixel array. The first direction is inclined at a first angle relative to a reference direction, and the second direction is inclined at a second angle relative to the reference direction. Each four sub-pixels of the plurality of sub-pixels form a virtual quadrangle. The each four sub-pixels include two sub-pixels having a same color, and the two sub-pixels having the same color are arranged at adjacent vertexes of the virtual quadrangle in one of the first direction and the second direction.

20 Claims, 15 Drawing Sheets

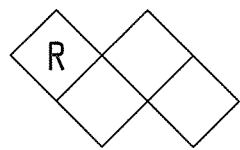 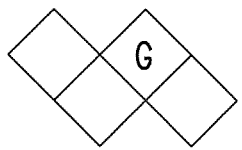 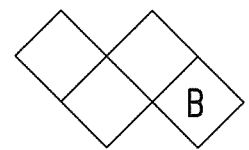
FIG. 5G  FIG. 5H  FIG. 5I
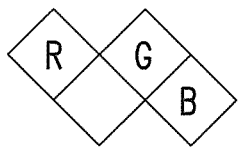
FIG. 5J
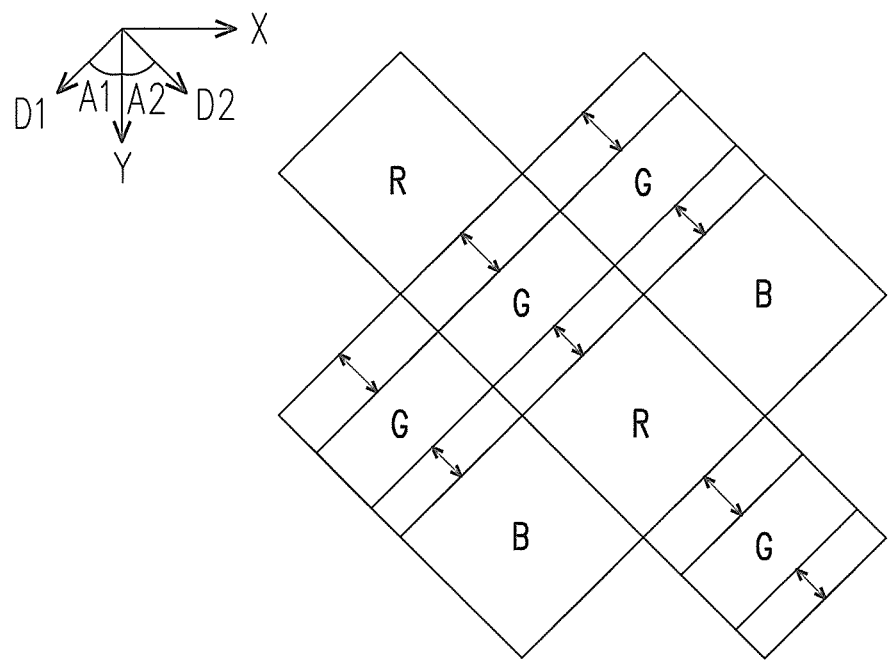
FIG. 6

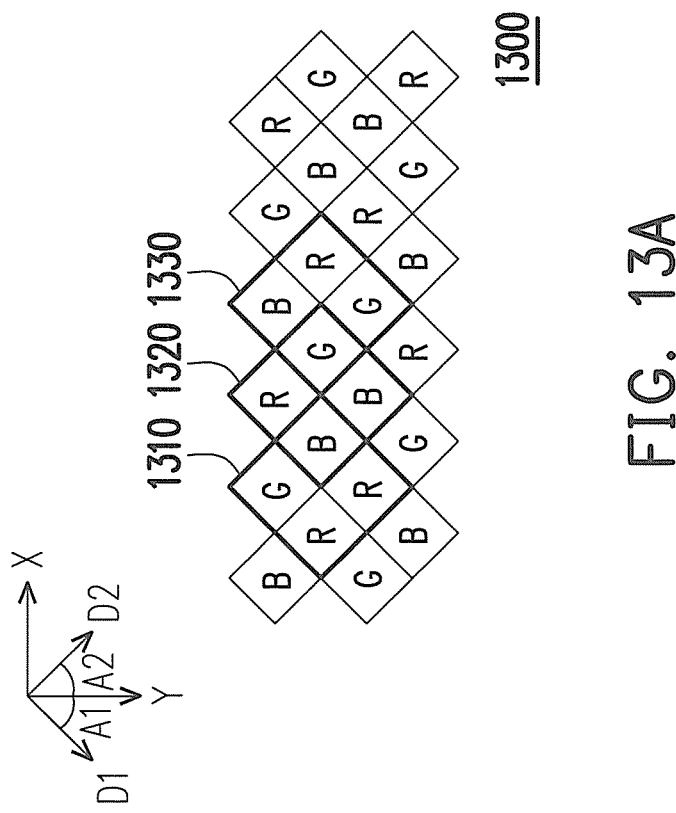

SUB-PIXEL ARRANGEMENT STRUCTURE OF ORGANIC LIGHT EMITTING DIODE DISPLAY

BACKGROUND OF THE INVENTION

1. Field of the Invention

The present invention generally relates to flat display technology, in particular, to a sub-pixel arrangement structure of an organic light emitting diode (OLED) display.

2. Description of Related Art

With the rapid development of display technology, the market shows growing demands for high resolution, high brightness, and low power consumption in terms of the performance of display panels. However, with increases in a resolution of the display panel, because an amount of sub-pixels on the display panel also increases in order to display in high resolution, a manufacturing cost is also increased accordingly. In order to reduce the manufacturing cost of the display panel, a sub-pixel rendering (SPR) method have come into being. A display apparatus generally uses different arrangements and designs of the sub-pixels to formulate a proper algorithm so that the resolution may be increased to a sub-pixel resolution when an image is displayed. Because a size of the sub-pixel is smaller than that of a pixel, a resolution that is visible by human eye (i.e., a visual resolution) may be increased. In addition, a display driver may write pixel data into the display panel to display image frames according to different magnifications, so as to improve a light transmittance of the display panel. However, since the manufacturing of OLED materials in an OLED display is highly related to the fabrication process, fabrication issues may be encountered as the resolution of the OLED display increases, even may become the bottleneck to achieve high-resolution image display. Hence, how to design an OLED display that is capable of overcoming the above problems and achieving high resolution is an important issue that needs to be solved.

SUMMARY OF THE INVENTION

Accordingly, the present invention is directed to sub-pixel arrangement structures of an organic light emitting diode (OLED) display, which is capable of overcoming fabrication limitations and enhancing the light transmittance and the aperture ratio, thereby providing a good display quality with extending lifetime of the OLED display.

The invention provides a sub-pixel arrangement structure of an OLED display, including a plurality of sub-pixels arranged in a first direction and a second direction to form a sub-pixel array. The first direction is inclined at a first angle relative to a reference direction, and the second direction is inclined at a second angle relative to the reference direction. Each four sub-pixels of the plurality of sub-pixels form a virtual quadrangle, the each four sub-pixels include two sub-pixels having a same color, and the two sub-pixels having the same color are arranged at adjacent vertexes of the virtual quadrangle in one of the first direction and the second direction.

In an embodiment of the invention, the virtual quadrangles include a first virtual quadrangle and a second virtual quadrangle adjacently arranged in the reference direction. A color arrangement of the sub-pixels of the first virtual quadrangle that rotates by 180 degrees is identical to a color arrangement of the sub-pixels of the second virtual quadrangle.

In an embodiment of the invention, the virtual quadrangles include a third virtual quadrangle adjacently arranged to the first virtual quadrangle in a third direction, and the third direction is perpendicular to the reference direction. The color arrangement of the sub-pixels of the first virtual quadrangle that rotates by 180 degrees is identical to a color arrangement of the sub-pixels of the third virtual quadrangle.

In an embodiment of the invention, the virtual quadrangles include a first virtual quadrangle and a second virtual quadrangle adjacently arranged in the reference direction. A color arrangement of the sub-pixels of the first virtual quadrangle that is mirrored with respect to the one of the first direction and the second direction is identical to a color arrangement of the sub-pixels of the second virtual quadrangle.

In an embodiment of the invention, the virtual quadrangles include a third virtual quadrangle adjacently arranged to the first virtual quadrangle in a third direction, and the third direction is perpendicular to the reference direction. The color arrangement of the sub-pixels of the first virtual quadrangle that is mirrored with respect to the one of the first direction and the second direction is identical to a color arrangement of the sub-pixels of the third virtual quadrangle.

In an embodiment of the invention, the virtual quadrangles include a first virtual quadrangle, a second virtual quadrangle and a third virtual quadrangle adjacently and sequentially arranged in a third direction, and the third direction is perpendicular to the reference direction. Two sub-pixels of the first virtual quadrangle have a same first color, two sub-pixels of the second virtual quadrangle have a same second color, and two sub-pixels of the third virtual quadrangle have a same third color. The first color, the second color, and the third color are distinct from one another.

In an embodiment of the invention, a summation of the first angle and the second angle is larger than or substantially equal to 90 degrees.

In an embodiment of the invention, the OLED display includes scan lines, and the scan lines are arranged in the reference direction.

In an embodiment of the invention, the plurality of sub-pixels have a same size.

In an embodiment of the invention, shapes of the plurality of sub-pixels are square or diamond.

In an embodiment of the invention, the each four sub-pixels include red, green and blue sub-pixels, and the two sub-pixels having the same color are the red, the green or the blue sub-pixels.

The invention provides a sub-pixel arrangement structure of an OLED display, including a plurality of sub-pixels arranged in a first direction and a second direction to form a sub-pixel array. The first direction is inclined at a first angle relative to a reference direction, and the second direction is inclined at a second angle relative to the reference direction. The plurality of sub-pixels include a sub-pixel group having six sub-pixels. The six sub-pixels form a virtual quadrangle and include at least two sub-pixels having a same color, and the at least two sub-pixels having the same color are arranged at one vertex of the virtual quadrangle.

In an embodiment of the invention, the at least two sub-pixels include two first sub-pixels and two second sub-pixels. The two first sub-pixels are arranged at the one vertex of the virtual quadrangle and have a same first color, and the two second sub-pixels are arranged at another vertex of the virtual quadrangle and have a same second color.

In an embodiment of the invention, the six sub-pixels further include two third sub-pixels have a same third color, and the two third sub-pixels are separately arranged at other vertexes of the virtual quadrangle.

In an embodiment of the invention, the first color is selected from one of red, green and blue, the second color is selected from another one of red, green and blue, and the third color is selected from yet another one of red, green and blue.

In an embodiment of the invention, a summation of the first angle and the second angle is larger than or substantially equal to 90 degrees.

In an embodiment of the invention, the OLED display includes scan lines, and the scan lines are arranged in the reference direction.

In an embodiment of the invention, the at least two sub-pixels of the six sub-pixels have a same size smaller than sizes of rest sub-pixels of the six sub-pixels.

In an embodiment of the invention, shapes of the at least two sub-pixels of the six sub-pixels are rectangle or parallelogram, and shapes of rest sub-pixels of the six sub-pixels are square or diamond.

In an embodiment of the invention, the at least two sub-pixels are driven by a single driver or by two separate drivers.

Based on the above, the sub-pixel arrangement structure of the OLED display disclosed by the embodiments of the invention adaptively arranges sub-pixels of same color adjacent to effectively enlarge the emission area. Accordingly, both fabrication limitations and display quality, such as light transmittance and aperture ratio, may be taken into account.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A to 5J are schematic diagrams illustrating pixel types according to an embodiment of the invention.

FIG. 6 is a schematic diagram illustrating a top view of a display panel according to the sub-pixel arrangement structure in the embodiment of FIG. 3.

FIG. 13A is a schematic diagram illustrating a top view of a display panel according to the sub-pixel arrangement structure in the embodiment of FIG. 12.

DESCRIPTION OF THE EMBODIMENTS

Figure 1:
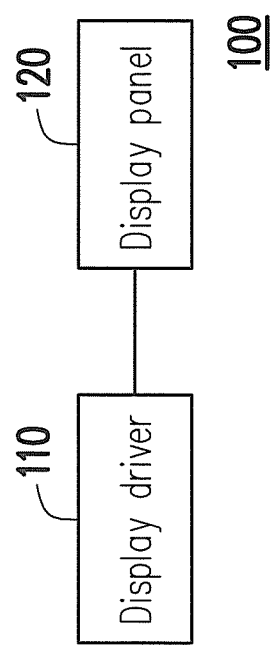
FIG. 1 is a schematic diagram illustrating a display apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a display apparatus according to an embodiment of the invention. Referring to FIG. 1, a display apparatus 100 in the present embodiment may be an OLED display, including a display driver 110 and a display panel 120. The display driver 110 is coupled to the display panel 120. The display driver 110 drives the display panel 120 to display image by using sub-pixel rendering (SPR) technology. In this embodiment, the display panel 120 includes a pixel array (not illustrated in FIG. 1). The pixel array includes a plurality of color pixels, which are used for producing different colors, such as red, green and blue. The display driver 110 may drive, for example, two different color pixels for performing color mixing to display image frames. For convenience, red sub-pixels, green sub-pixels and blue sub-pixels are used for indicating the color pixels of red, green and blue respectively in the following description.

Specifically, each of the color pixels is generally defined by a region enclosed by two adjacent scan lines and two adjacent data lines. Besides, each of the color pixels includes a scan line and a data line, which are electrically connected with one OLED thin film. The OLED thin film may be used for producing colors of light, which may be patterned consistent with the design of a fine metal mask. In other words, a pattern of the OLED thin films on the display panel 120 may be affected by fabrication process. Additionally, Shapes of the OLED thin films may be different from shapes of the defined color pixels, and thereby the arrangement of the OLED thin films may have different arranging rules. Therefore, the embodiments of the invention may overcome the fabrication limitations by adjusting the configuration of the OLED thin films. Further, good display quality may be achieved.

It should be noted that, since the OLED thin films substantially correspond to the color pixels respectively, a "sub-pixel" is used for indicating the OLED thin film on the display panel 120, and thereby a "sub-pixel arrangement structure" is used for indicating the configuration of the OLED thin films on the display panel 120 in the following description.

Figure 2:
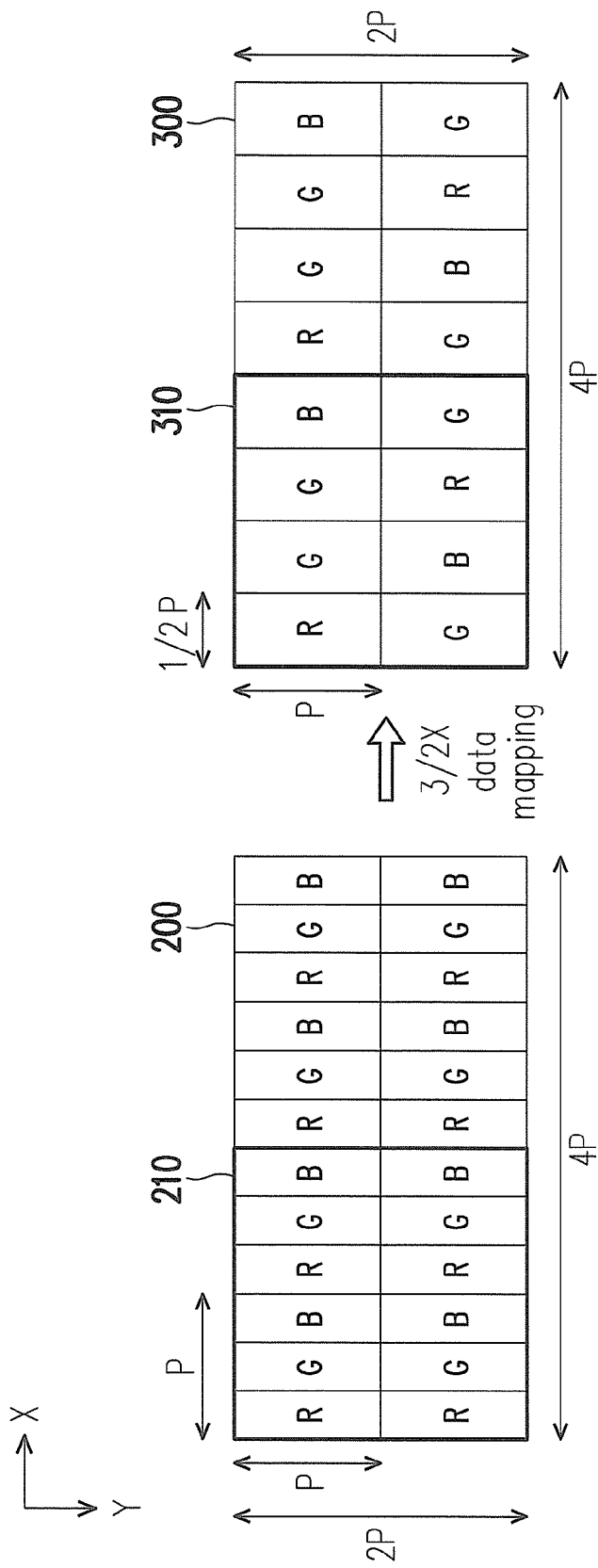
FIG. 2 is a schematic diagram illustrating a pixel array and pixel data thereof according to an embodiment of the invention.
Figure 3:
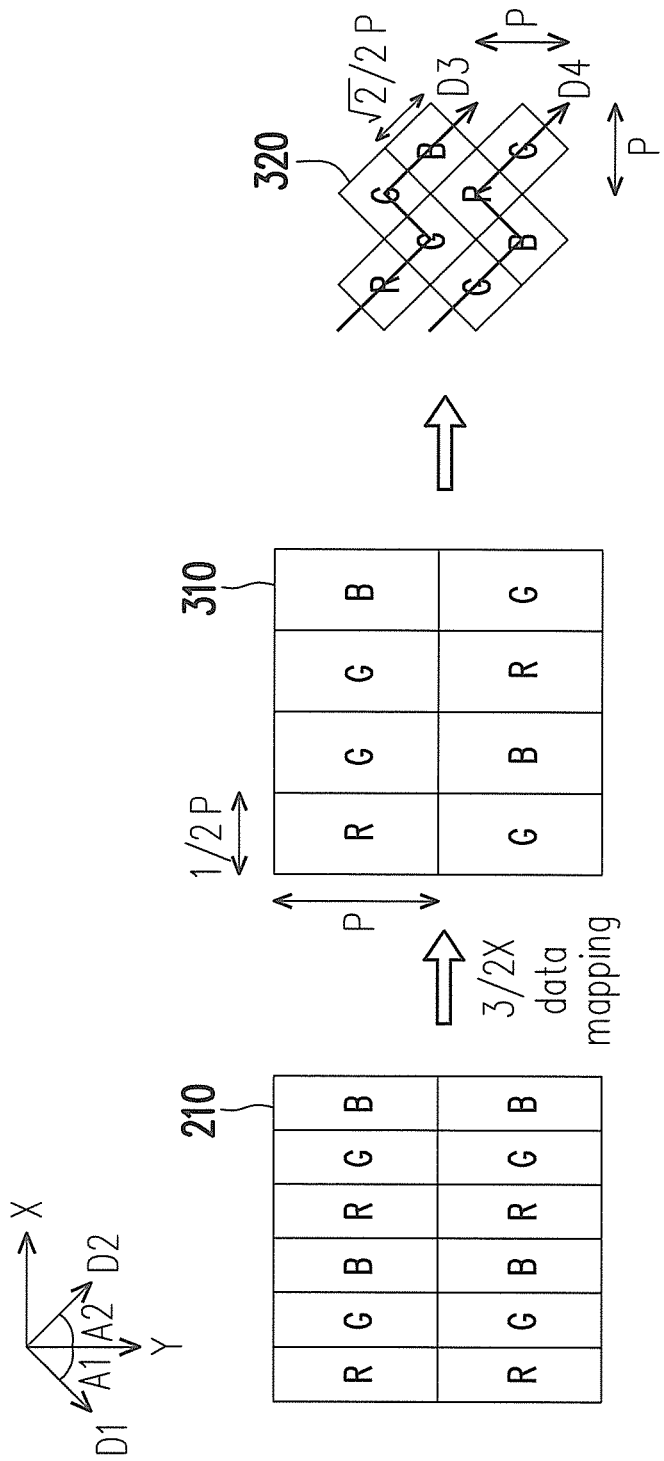
FIG. 3 is a schematic diagram illustrating a top view of a sub-pixel arrangement structure corresponding to the pixel array and the pixel data in the embodiment of FIG. 2.

FIG. 2 is a schematic diagram illustrating a pixel array and pixel data thereof according to an embodiment of the invention. FIG. 3 is a schematic diagram illustrating a top view of a sub-pixel arrangement structure corresponding to the pixel array and the pixel data in the embodiment of FIG. 2. Referring to FIG. 1 to FIG. 3, in this embodiment, the display driver 110, for example, drives the display panel 120 to display image by writing pixel data 200 into a pixel array 300. The pixel array 300 in this embodiment may be part or all of pixel array on the display panel 120. In addition, a pixel group 310 is arranged repeatedly to form the pixel array 300. In the embodiment of FIG. 2, a 4×2 array of pixel data is illustrated for the pixel data 200, which is written into the pixel array 300 with the same width as the pixel data 200. However, it should be noted that the invention is not intended to limit the dimension of the pixel data 200 and width of the pixel array 300, which may be adjusted according to the design requirements. Besides, the pixel data 200 includes red components R, green components G and blue components B, and the pixel array 300 includes color pixels, including red sub-pixels R, green sub-pixels G and blue sub-pixels B, as illustrated in FIG. 2

In the present embodiment, the display driver 110 may write pixel data 210 with dimensions of 2×2 into the pixel group 310 by performing a 3/2 X data mapping (i.e. mapping three data into two sub-pixels). In detail, the pixel group 310 may be a rectangle-shaped array, which includes two rows of color pixels in an X direction and four columns of color pixels in a Y direction. Besides, scan lines of the display panel 120 may be arranged in the Y direction, and data lines of the display panel 120 may be arranged in the X direction. However, it should be noted that the invention is not limited thereto. The arrangement of the scan lines and the data lines of the display panel 120 may be adjusted according to the design requirements.

Referring to a sub-pixel arrangement structure 320 in the embodiment of FIG. 3, the shapes of each of the sub-pixels are square, while the shapes of the color pixels in the pixel group 310 are rectangle. Besides, in the sub-pixel arrangement structure 320, the sub-pixels may be arranged in a D1 direction and a D2 direction, while the color pixels in the pixel group 310 may be arranged in the X direction and in the Y direction, where the D1 direction is inclined at a first angle A1 relative to a reference direction (i.e. the Y direction), and the D2 direction is inclined at a second angle A2 relative to the reference direction (i.e. the Y direction). Here, the first angle A1 and the second angle A2 may be both 45 degree.

Specifically, in the sub-pixel arrangement structure 320, a first sequence along an arrangement path D3 includes the red sub-pixel R, the green sub-pixel G, the green sub-pixel G and the blue sub-pixel B, and a second sequence along an arrangement path D4 includes the green sub-pixel G, the blue sub-pixel B, the red sub-pixel R and the green sub-pixel G. Herein, the arrangement path D3 and D4 are paths composed of the D1 direction and the D2 direction.

It should be noted that the first sequence is similar to the arranging order of color pixels in the upper row of the pixel group 310 in the X direction, and the second sequence is similar to the arranging order of color pixels in the lower row of the pixel group 310 in the X direction.

Additionally, in the sub-pixel arrangement structure 320, each four sub-pixels may include two sub-pixels having a same color, and the two sub-pixels having the same color may be arranged at adjacent vertexes of the virtual quadrangle in one of the D1 direction and the D2 direction.

Figure 4:
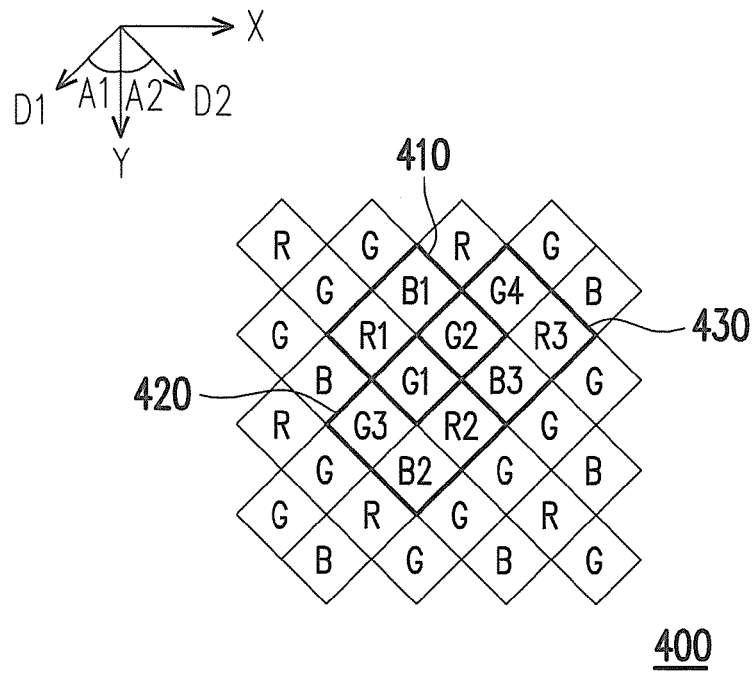
FIG. 4 is a schematic diagram illustrating a top view of a display panel according to the sub-pixel arrangement structure in the embodiment of FIG. 3.

The aforementioned virtual quadrangle may be illustrated clearly with reference to FIG. 4. FIG. 4 is a schematic diagram illustrating a top view of a display panel according to the sub-pixel arrangement structure in the embodiment of FIG. 3. Referring to FIG. 4, a plurality of red, green and blue sub-pixels are arranged in the D1 direction and the D2 direction to form a sub-pixel array on a display panel 400 according to the sub-pixel arrangement structure 320 in FIG. 3. In this arrangement, each four sub-pixels form a virtual quadrangle, such as virtual quadrangles 410, 420 and 430. In detail, the virtual quadrangle 410 may be formed by two green sub-pixels G1, G2, one blue sub-pixel B1 and one red sub-pixel R1. In addition, the green sub-pixels G1, G2 are arranged at adjacent vertexes of the virtual quadrangle 410 in the D1 direction.

Moreover, in the case of another virtual quadrangle 420, which is adjacently arranged to the virtual quadrangle 410 in the reference direction (i.e. the Y direction), the virtual quadrangle 420 may be formed by two green sub-pixels G1, G3, one blue sub-pixel B2 and one red sub-pixel R2. It should be noted that a color arrangement of the sub-pixels of the virtual quadrangle 410 that rotates by 180 degrees is identical to a color arrangement of the sub-pixels of the virtual quadrangle 420.

As for the virtual quadrangle 430, which is adjacently arranged to the virtual quadrangle 410 in the X direction (which is perpendicular to the Y direction), the virtual quadrangle 430 may be formed by two green sub-pixels G4, G2, one blue sub-pixel B3 and one red sub-pixel R3. It should be also noted that the color arrangement of the sub-pixels of the virtual quadrangle 410 that rotates by 180 degrees is identical to a color arrangement of the sub-pixels of the virtual quadrangle 430.

In this embodiment in FIG. 4, a summation of the first angle A1 and the second angle A2 is substantially equal to 90 degrees, while in other embodiments of the invention, the summation may be larger than 90 degrees.

As such, by using the sub-pixel arrangement structure 320 to arrange the sub-pixels on the display panel 400, each two green sub-pixels may be arranged adjacently, so as to effectively enlarge the emission area of the green sub-pixels. Therefore, fabrication limitations may be overcome. Also, light transmittance of the green light and its color appearance or saturation may be improved, and aperture ratio of the green sub-pixels may increase for extending lifetime of the OLED of the display panel 120. Besides, larger layout area for the source wiring of sub-pixels may be also provided.

Figure 5A:
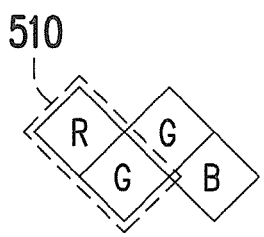
Figure 5B:
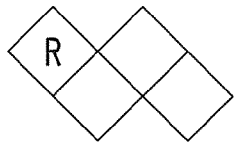
Figure 5C:
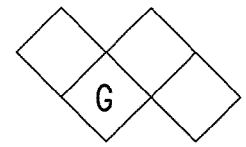
Figure 5D:
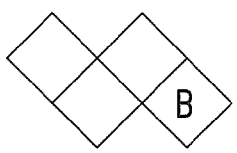
Figure 5E:
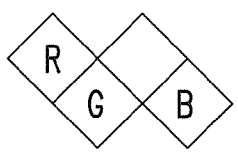
Figure 5F:
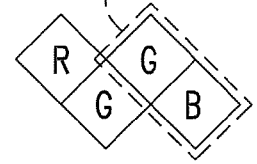

It is worth mentioning that two sub-pixels with different colors may be deemed as a pixel unit to be combined and arranged to form the sub-pixel arrangement structure 320 of the aforementioned embodiment. More specifically, FIG. 5A to FIG. 5J are schematic diagrams illustrating pixel types according to an embodiment of the invention. Referring to FIG. 5A and FIG. 5F at first, a pixel unit 510 includes a red sub-pixel R and a green sub-pixel G, and a pixel unit 520 includes a green sub-pixel G and a blue sub-pixel B, where the green sub-pixels G of the pixel unit 510 and the pixel unit 520 are arranged adjacently.

Then, referring to FIG. 5A to FIG. 5E, once pixel data to be written into the pixel unit 510 includes colors of red and/or green, the display driver 110 may directly drive the red sub-pixel R and/or green sub-pixel G in the pixel unit 510. On the other hand, if the pixel data to be written into the pixel unit 510 includes colors of blue, the display driver 110 may drive the blue sub-pixel B in the adjacent pixel unit

520. Besides, for displaying the white color, the display driver 110 may drive the red sub-pixel R and green sub-pixel G in the pixel unit 510 with the blue sub-pixel B in the adjacent pixel unit 520 together for color mixing.

Referring to FIG. 5F to FIG. 5J, similarly, once pixel data to be written into the pixel unit 520 includes colors of green and/or blue, the display driver 110 may directly drive the green sub-pixel G and/or blue sub-pixel B in the pixel unit 520. On the other hand, if the pixel data to be written into the pixel unit 520 includes colors of red, the display driver 110 may drive the red sub-pixel R in the adjacent pixel unit 510. Besides, for displaying the white color, the display driver 110 may drive the green sub-pixel G and blue sub-pixel B in the pixel unit 520 with the red sub-pixel R in the adjacent pixel unit 510 together for color mixing.

In the previous embodiments, the sub-pixels in the sub-pixel arrangement structure 320 may have a same size. In the embodiment of FIG. 3 as an example, each of the sub-pixels in the sub-pixel arrangement structure 320 may have a side length of $\sqrt{2}/2$ P and a diagonal length P, where the "P" is indicated a pixel pitch as a length unit. It should be noted that the said diagonal length may be the same as a side length of the color pixels in the pixel group 310 in the Y direction. In other embodiments, sizes of the sub-pixels in the sub-pixel arrangement structure 320 may be adjusted adaptively, thereby the sub-pixels with different colors may have different sizes.

FIG. 6 is a schematic diagram illustrating a top view of a display panel according to the sub-pixel arrangement structure in the embodiment of FIG. 3. Referring to FIG. 6, a sub-pixel arrangement structure 600 in this embodiment is similar with the sub-pixel arrangement structure 320, where lengths of each sub-pixels in the sub-pixel arrangement structure 600 are adjusted. In detail, since the emission area of each of the green sub-pixels has already enlarged as described above, a side length in the D2 direction of each green sub-pixel may be reduced. Besides, a side length in the D2 direction of each of the sub-pixels of the rest colors, including red and blue sub-pixels, may increase correspondingly. As a result, in the embodiment of FIG. 6, a life time of the sub-pixels of rest colors may be extended, while a life time of the green sub-pixels would not be affected.

Figure 7:
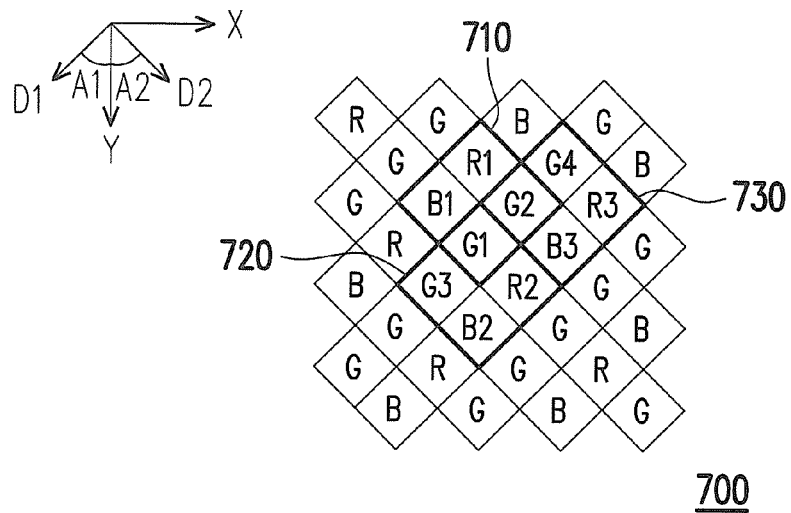
FIG. 7 is a schematic diagram illustrating a top view of a display panel according to a sub-pixel arrangement structure in an embodiment of the invention.

In one embodiment, parts of the red sub-pixels and parts of the blue sub-pixels may be reversed. FIG. 7 is a schematic diagram illustrating a top view of a display panel according to a sub-pixel arrangement structure in an embodiment of the invention. This embodiment is similar to the aforementioned embodiment in FIG. 4. Therefore, details of the same or similar elements are not repeated hereinafter.

Referring to FIG. 7, each four sub-pixels form a virtual quadrangle, such as virtual quadrangles 710, 720 and 730. In detail, the virtual quadrangle 710 may be formed by two green sub-pixels G1, G2, one blue sub-pixel B1 and one red sub-pixel R1, where the blue sub-pixel B1 and the red sub-pixel R1 included in the virtual quadrangle 710 are arranged opposite to the blue sub-pixel B1 and the red sub-pixel R1 included in the virtual quadrangle 410 in FIG. 4.

Further, in the case of another virtual quadrangle 720, which is adjacently arranged to the virtual quadrangle 710 in the reference direction (i.e. the Y direction), the virtual quadrangle 720 may be formed by two green sub-pixels G1, G3, one blue sub-pixel B2 and one red sub-pixel R2. It is worth mentioning that a color arrangement of the sub-pixels of the virtual quadrangle 710 that is mirrored with respect to the D1 direction is identical to a color arrangement of the sub-pixels of the virtual quadrangle 720.

Besides, in the case of a virtual quadrangle 730, which is adjacently arranged to the virtual quadrangle 710 in the X direction (which is perpendicular to the Y direction), the virtual quadrangle 730 may be formed by two green sub-pixels G, one blue sub-pixel B and one red sub-pixel R. It should be also noted that the color arrangement of the sub-pixels of the virtual quadrangle 710 that is mirrored with respect to the D1 direction is identical to a color arrangement of the sub-pixels of the virtual quadrangle 730.

In other embodiments, the color arrangement of the sub-pixels of the virtual quadrangle 710 that is mirrored with respect to the one of the D1 direction and the D2 direction is identical to a color arrangement of the sub-pixels of the virtual quadrangle 720. In addition, the color arrangement of the sub-pixels of the virtual quadrangle 710 that is mirrored with respect to the one of the D1 direction and the D2 direction is identical to a color arrangement of the sub-pixels of the virtual quadrangle 730. In other words, the invention is not intended to limit the mirrored directions for arranging two virtual quadrangles to a single direction.

The aforementioned embodiments are applied for the case of adjacent green sub-pixels. Next, embodiments of adjacent red sub-pixels and adjacent blue sub-pixels are illustrated in FIG. 8 and FIG. 9 respectively.

Figure 8:
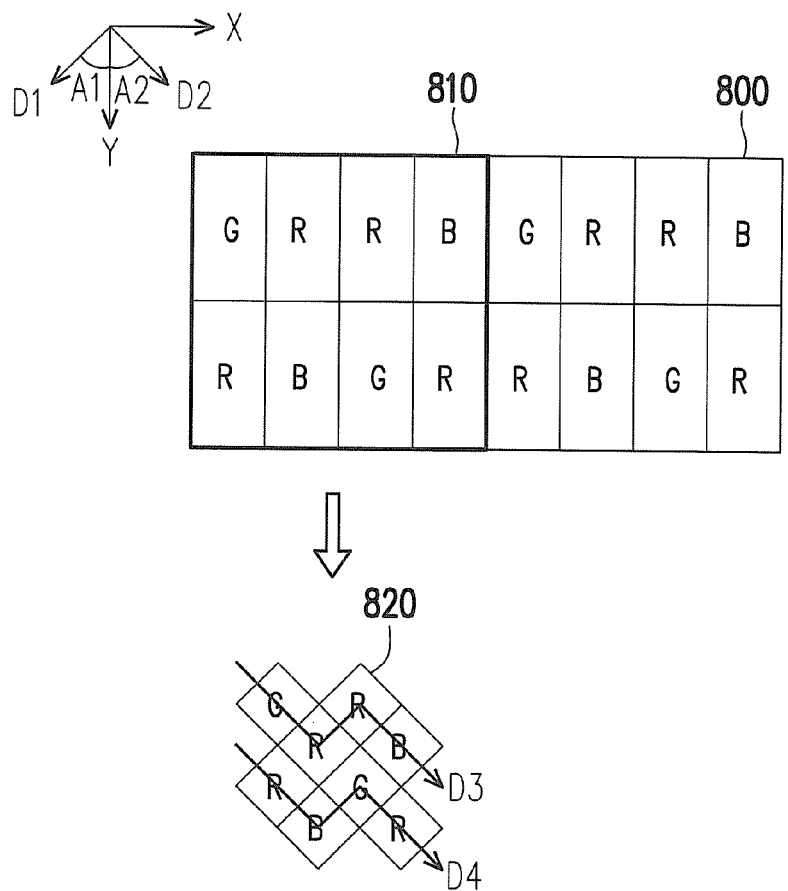
FIG. 8 and FIG. 9 are schematic diagrams respectively illustrating a top view of a sub-pixel arrangement structure and a pixel array corresponding to the pixel data in the embodiment of FIG. 2
Figure 9:
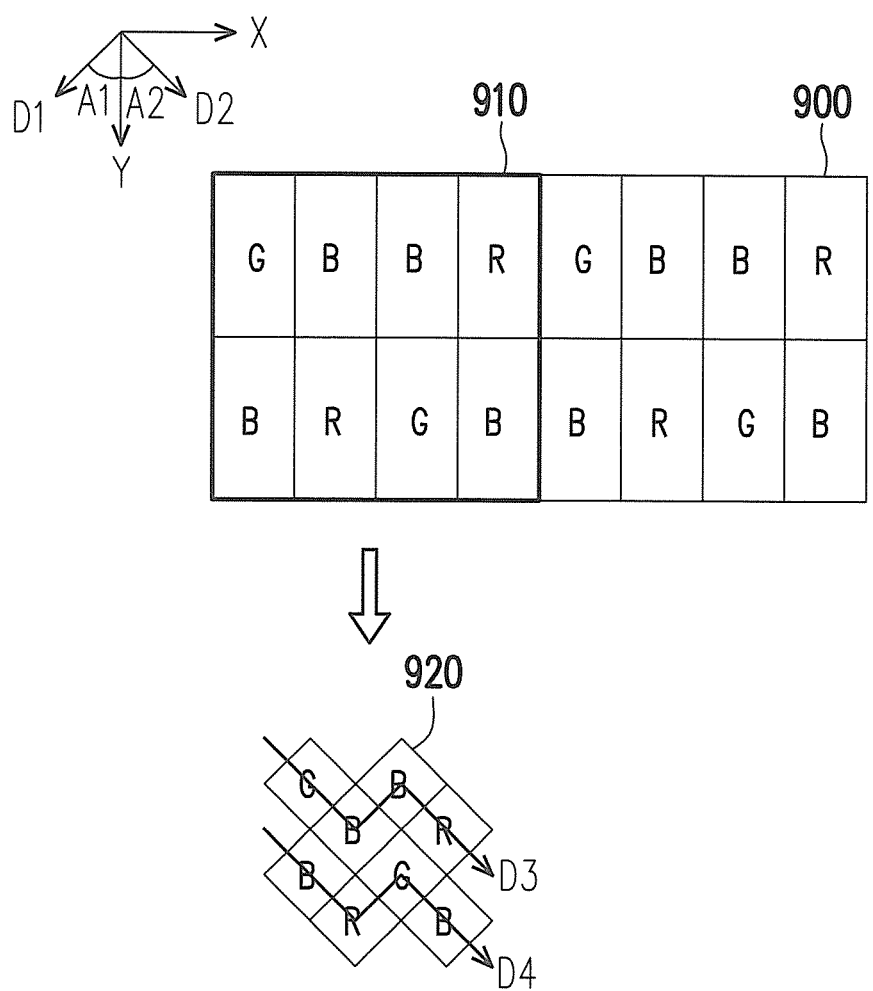

FIG. 8 is a schematic diagram illustrating a top view of a sub-pixel arrangement structure and a pixel array corresponding to the pixel data in the embodiment of FIG. 2. Referring to FIG. 1, FIG. 2 and FIG. 8, in this embodiment, the display driver 110, for example, drives the display panel 120 to display image by writing pixel data 200 into a pixel array 800. Specifically, the display driver 110 may write pixel data 210 with dimensions of 2×2 into the pixel group 810 by performing a 3/2 X data mapping. This embodiment is similar to the aforementioned embodiment. Therefore, details of the same or similar elements are not repeated hereinafter.

In the present embodiment, the sub-pixel arrangement structure 820 includes sub-pixels arranged in a D1 direction and a D2 direction according to the arrangement of the pixel group 810. Specifically, in the sub-pixel arrangement structure 820, a first sequence along an arrangement path D3 includes the green sub-pixel G, the red sub-pixel R, the red sub-pixel R and the blue sub-pixel B, and a second sequence along an arrangement path D4 includes the red sub-pixel R, the blue sub-pixel B, the green sub-pixel G and the red sub-pixel R. Herein, the arrangement path D3 and D4 are paths composed of the D1 direction and the D2 direction.

Similarly, the first sequence is similar to the arranging order of color pixels in the upper row of the pixel group 810 in the X direction, and the second sequence is similar to the arranging order of color pixels in the lower row of the pixel group 810 in the X direction.

Besides, it should be noted that in the embodiment of FIG. 8, each virtual quadrangle may include two red sub-pixels arranged at adjacent vertexes in the D1 direction, so as to enlarge the emission area of the red sub-pixels.

FIG. 9 is a schematic diagram illustrating a top view of a sub-pixel arrangement structure and a pixel array corresponding to the pixel data in the embodiment of FIG. 2. Referring to FIG. 1, FIG. 2 and FIG. 9, in this embodiment, the display driver 110, for example, drives the display panel 120 to display image by writing pixel data 200 into a pixel array 900. Specifically, the display driver 110 may write pixel data 210 with dimensions of 2×2 into the pixel group 910 by performing a 3/2 X data mapping. This embodiment is similar to the aforementioned embodiment. Therefore, details of the same or similar elements are not repeated hereinafter.

In the present embodiment, the sub-pixel arrangement structure 920 includes sub-pixels arranged in a D1 direction and a D2 direction according to the arrangement of the pixel group 910. Specifically, in the sub-pixel arrangement structure 920, a first sequence along an arrangement path D3 includes the green sub-pixel G, the blue sub-pixel B, the blue sub-pixel B and the red sub-pixel R, and a second sequence along an arrangement path D4 includes the blue sub-pixel B, the red sub-pixel R, the green sub-pixel G and the blue sub-pixel B. Herein, the arrangement path D3 and D4 are paths composed of the D1 direction and the D2 direction.

Similarly, the first sequence is similar to the arranging order of color pixels in the upper row of the pixel group 910 in the X direction, and the second sequence is similar to the arranging order of color pixels in the lower row of the pixel group 910 in the X direction.

Besides, it should be noted that in the embodiment of FIG. 9, each virtual quadrangle may include two blue sub-pixels arranged at adjacent vertexes in the D1 direction, so as to enlarge the emission area of the blue sub-pixels.

Figure 10:
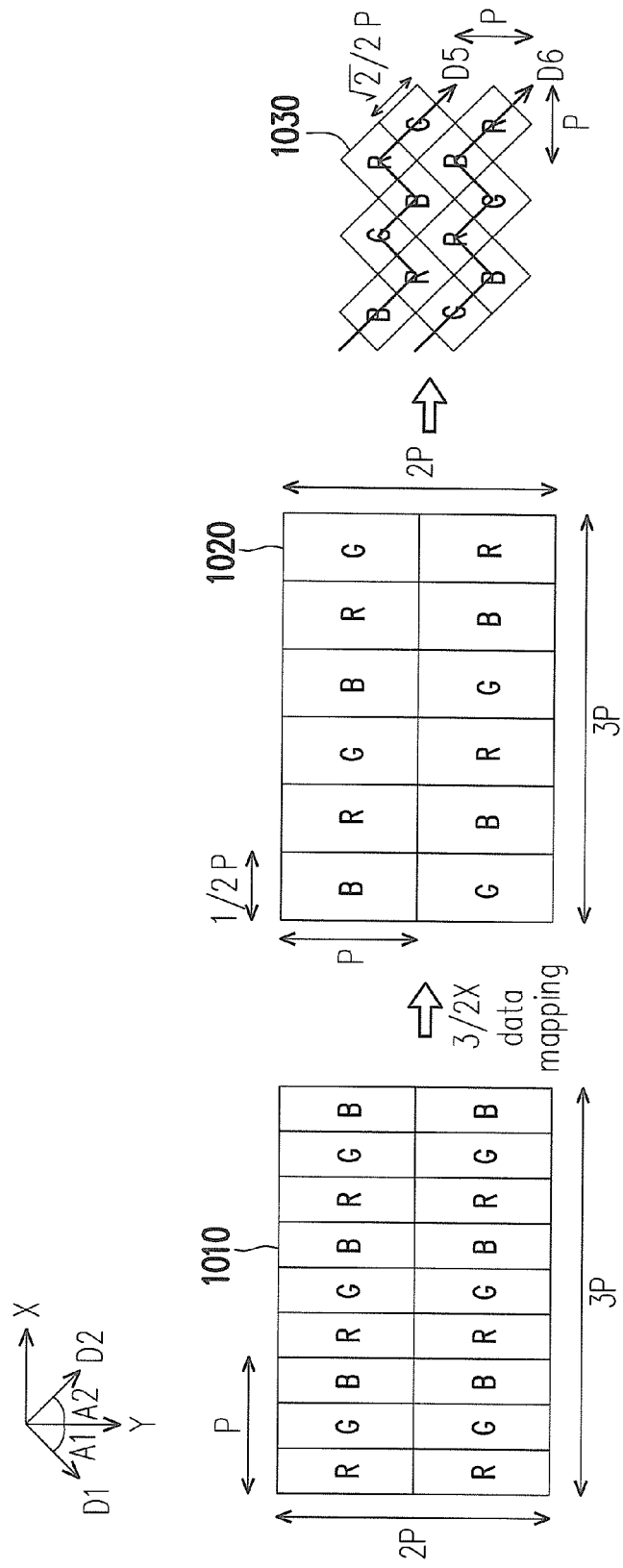
FIG. 10 is a schematic diagram illustrating a top view of a sub-pixel arrangement structure corresponding to a pixel array and pixel data according to an embodiment of the invention.

In the aforementioned embodiments, the sub-pixels of one color may be arranged adjacent to enlarge the emission area. Next, adjacent subpixels of more than one color may be described as follows. FIG. 10 is a schematic diagram illustrating a top view of a sub-pixel arrangement structure corresponding to a pixel array and pixel data according to an embodiment of the invention. Referring to FIG. 1 and FIG. 10, the display driver 110 may write pixel data 1010 with dimensions of 3×2 into the pixel group 1020 by performing a 3/2 X data mapping. In the present embodiment, the sub-pixel arrangement structure 1030 includes sub-pixels arranged in a D1 direction and a D2 direction according to the arrangement of the pixel group 1020. This embodiment is similar to the aforementioned embodiment. Therefore, details of the same or similar elements are not repeated hereinafter.

Specifically, in the sub-pixel arrangement structure 1030, a first sequence along an arrangement path D5 includes the blue sub-pixel B, the red sub-pixel R, the green sub-pixel G, the red sub-pixel R, the red sub-pixel R and the green sub-pixel G, and a second sequence along an arrangement path D6 includes the green sub-pixel G, the blue sub-pixel B, the red sub-pixel R, the green sub-pixel G, the blue sub-pixel B and the red sub-pixel R. Herein, the arrangement path D5 and D6 are paths composed of the D1 direction and the D2 direction. Similarly, the first sequence is similar to the arranging order of color pixels in the upper row of the pixel group 1020 in the X direction, and the second sequence is similar to the arranging order of color pixels in the lower row of the pixel group 1020 in the X direction.

Figure 11A:
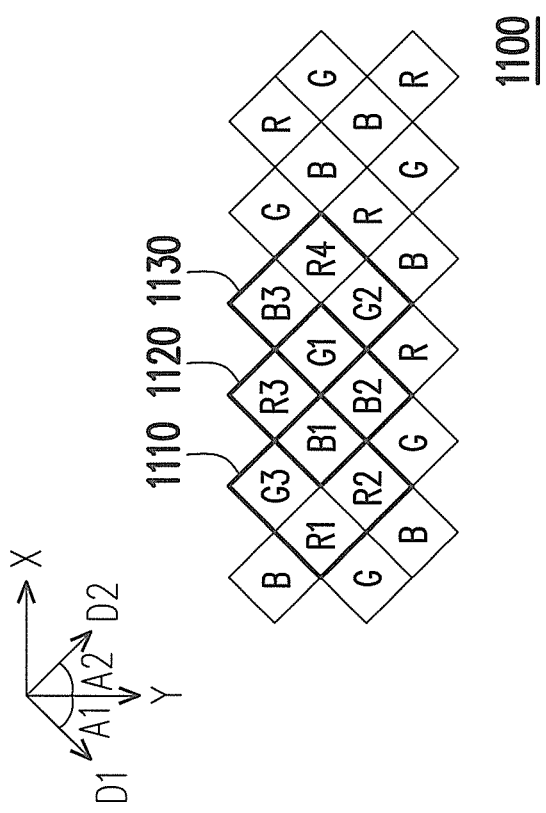
FIG. 11A is a schematic diagram illustrating a top view of a display panel according to the sub-pixel arrangement structure in the embodiment of FIG. 10.

FIG. 11A is a schematic diagram illustrating a top view of a display panel according to the sub-pixel arrangement structure in the embodiment of FIG. 10. Referring to FIG. 11A, a plurality of red, green and blue sub-pixels are arranged in the D1 direction and the D2 direction to form a sub-pixel array on a display panel 1100 according to the sub-pixel arrangement structure 1030 in FIG. 10. In this arrangement, each four sub-pixels form a virtual quadrangle, such as virtual quadrangles 1110, 1120 and 1130, which are adjacently and sequentially arranged in the X direction, which is perpendicular to the reference direction (i.e. the Y direction).

It is worth mentioning that, in the present embodiment, two sub-pixels of the virtual quadrangle 1110 have a same first color, two sub-pixels of the virtual quadrangle 1120 have a same second color, and two sub-pixels of the virtual quadrangle 1130 have a same third color, where the first color, the second color, and the third color are distinct from one another.

In the embodiment of FIG. 11A as an example, the virtual quadrangle 1110 may includes two red sub-pixels, the virtual quadrangle 1120 may includes two blue sub-pixels, and the virtual quadrangle 1130 may includes two green sub-pixels. More specifically, the virtual quadrangle 1110 may be formed by two red sub-pixels R1, R2, one blue sub-pixel B1 and one green sub-pixel G3. The virtual quadrangle 1120 may be formed by two blue sub-pixels B1, B2, one green sub-pixel G1 and one red sub-pixel R3. The virtual quadrangle 1130 may be formed by two green sub-pixels G1, G2, one red sub-pixel R4 and one blue sub-pixel B3.

Figure 11B:
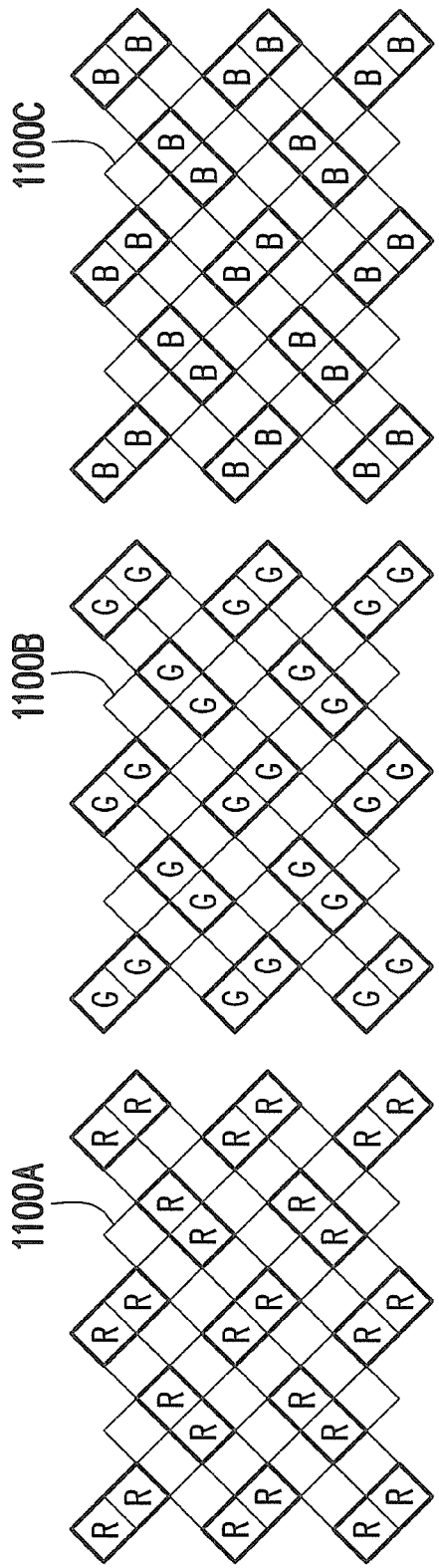
FIG. 11B is a schematic diagram illustrating a top view of parts of the sub-pixels on the display panel in the embodiment of FIG. 11A.

FIG. 11B is a schematic diagram illustrating a top view of parts of the sub-pixels on the display panel in the embodiment of FIG. 11A. Referring to FIG. 11B, an arrangement 1100A illustrates the distribution of the red sub-pixels R on the display panel 1100, an arrangement 1100B illustrates the distribution of the green sub-pixels G on the display panel 1100, and an arrangement 1100C illustrates the distribution of the blue sub-pixels B on the display panel 1100. Thus, it may be seen that by using the sub-pixel arrangement structure 1030 to arrange sub-pixels on the display panel 1100, each two sub-pixels with same color may be arranged adjacently, so as to enlarge the emission area of the sub-pixels of all colors.

It is worth mentioning that, in the embodiment of FIG. 10, each of the sub-pixels in the sub-pixel arrangement structure 320 may have a side length of $\sqrt{2}/2$ P and a diagonal length P, which is similar to the aforementioned embodiment, based on the same ratio for data mapping. Thus, the summation of the first angle A1 and the second angle A2 in the present embodiment may be substantially equal to 90 degrees.

Figure 12:
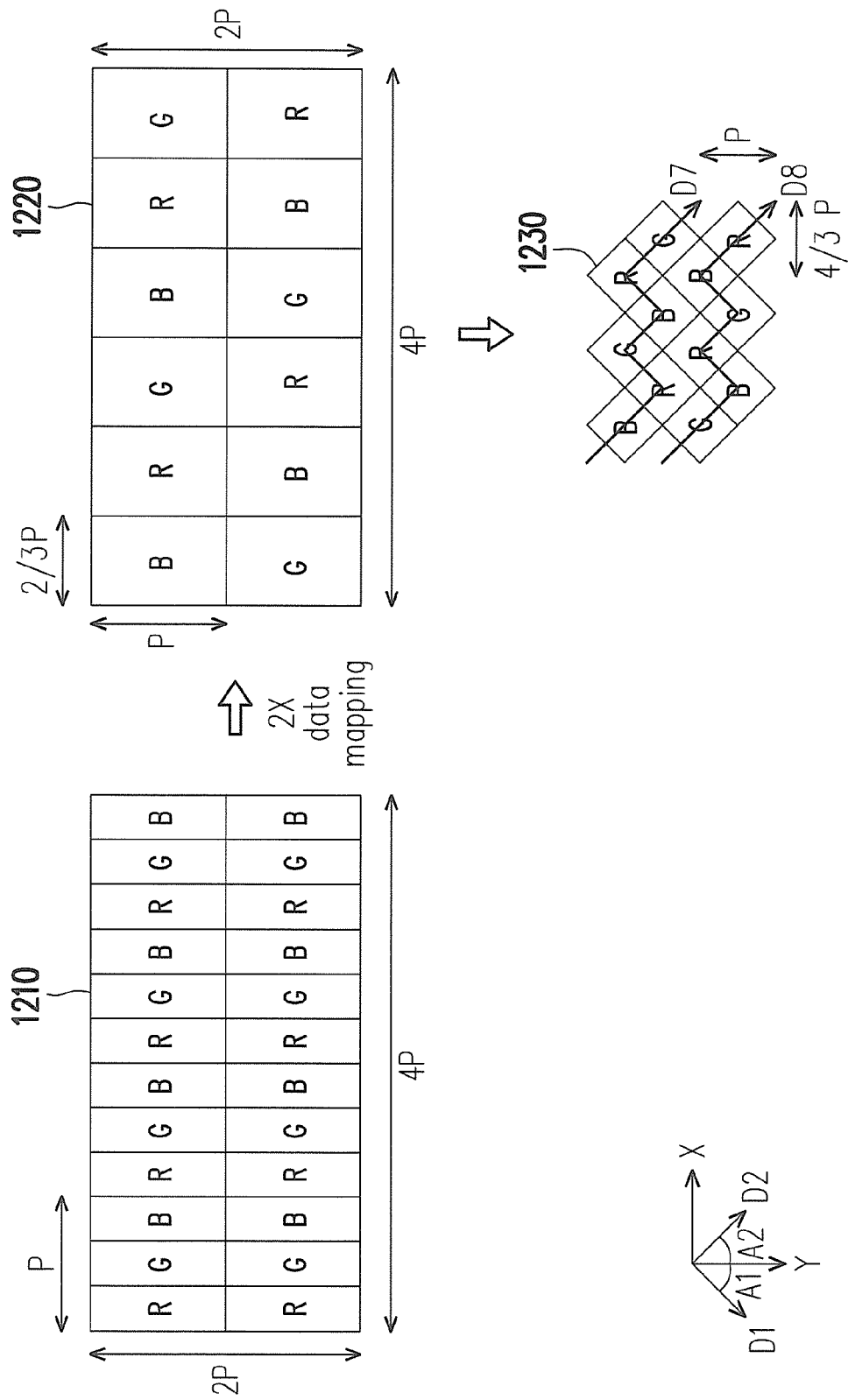
FIG. 12 is a schematic diagram illustrating a top view of a sub-pixel arrangement structure corresponding to a pixel array and pixel data according to an embodiment of the invention.

Some embodiments of the invention are also applicable for data mapping with different ratio. FIG. 12 is a schematic diagram illustrating a top view of a sub-pixel arrangement structure corresponding to a pixel array and pixel data according to an embodiment of the invention. Referring to FIG. 1 and FIG. 12, the display driver 110 may write pixel data 1210 with dimensions of 4×2 into the pixel group 1220 by performing a 2 X data mapping (i.e. mapping three data into one and half sub-pixels). In this embodiment, the sub-pixel arrangement structure 1230 includes sub-pixels arranged in a D1 direction and a D2 direction according to the arrangement of the pixel group 1220. This embodiment is similar to the aforementioned embodiment. Therefore, details of the same or similar elements are not repeated hereinafter.

It should be noted that, in this embodiment, the shape of each sub-pixel in the sub-pixel arrangement structure 1230 may be diamond with a diagonal length of P and the other diagonal length of 4/3 P. In other words, the D1 direction and the D2 direction in the present embodiment are different from the aforementioned embodiments, where the summation of the first angle A1 and the second angle A2 in the present embodiment may be larger than 90 degrees.

In the sub-pixel arrangement structure 1230, a first sequence along an arrangement path D7 includes the blue sub-pixel B, the red sub-pixel R, the green sub-pixel G, the red sub-pixel R, the red sub-pixel R and the green sub-pixel G, and a second sequence along an arrangement path D8 includes the green sub-pixel G, the blue sub-pixel B, the red sub-pixel R, the green sub-pixel G, the blue sub-pixel B and the red sub-pixel R. Herein, the arrangement path D7 and D8 are paths composed of the D1 direction and the D2 direction. Similarly, the first sequence is similar to the arranging order of color pixels in the upper row of the pixel group 1220 in the X direction, and the second sequence is similar to the arranging order of color pixels in the lower row of the pixel group 1220 in the X direction.

FIG. 13A is a schematic diagram illustrating a top view of a display panel according to the sub-pixel arrangement structure in the embodiment of FIG. 12. Referring to FIG. 13A, a plurality of red, green and blue sub-pixels are arranged in the D1 direction and the D2 direction to foam a sub-pixel array on a display panel 1300 according to the sub-pixel arrangement structure 1230 in FIG. 12. In this arrangement, each four sub-pixels form a virtual quadrangle, such as virtual quadrangles 1310, 1320 and 1330, which are adjacently and sequentially arranged in the X direction, which is perpendicular to the reference direction (i.e. the Y direction).

Since the sub-pixel arrangement structure 1230 in the embodiment of FIG. 12 is similar with the sub-pixel arrangement structure 1030 in the embodiment of FIG. 10, thereby the virtual quadrangles 1310, 1320 and 1330 may also similar with the virtual quadrangles 1110, 1120 and 1130 respectively. In other words, the virtual quadrangle 1310 may include two red sub-pixels, the virtual quadrangle 1320 may include two blue sub-pixels, and the virtual quadrangle 1330 may include two green sub-pixels.

Figure 13B:
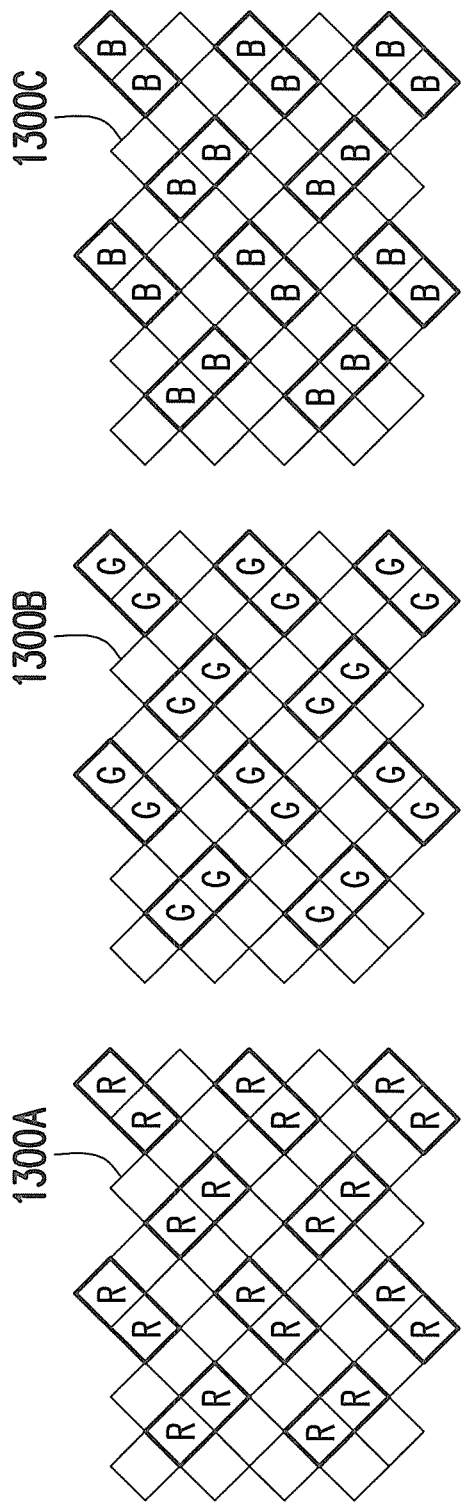
FIG. 13B is a schematic diagram illustrating a top view of parts of the sub-pixels on the display panel in the embodiment of FIG. 13A.

FIG. 13B is a schematic diagram illustrating a top view of parts of the sub-pixels on the display panel in the embodiment of FIG. 13A. Referring to FIG. 13B, an arrangement 1300A illustrates the distribution of the red sub-pixels R on the display panel 1300, an arrangement 1300B illustrates the distribution of the green sub-pixels G on the display panel 1300, and an arrangement 1300C illustrates the distribution of the blue sub-pixels B on the display panel 1300. Thus, it may be seen that by using the sub-pixel arrangement structure 1230 to arrange the sub-pixels on the display panel 1300, each two sub-pixels with same color may be arranged adjacently. Further, the area of each of the sub-pixels in the sub-pixel arrangement structure 1230 may be 2/3 $P^2$, which is larger than the area (i.e. 1/2 $P^2$) of each of the sub-pixels in the sub-pixel arrangement structure 1230. Thereby, the emission area of the sub-pixels of all colors may be enlarged more effectively.

Figure 14:
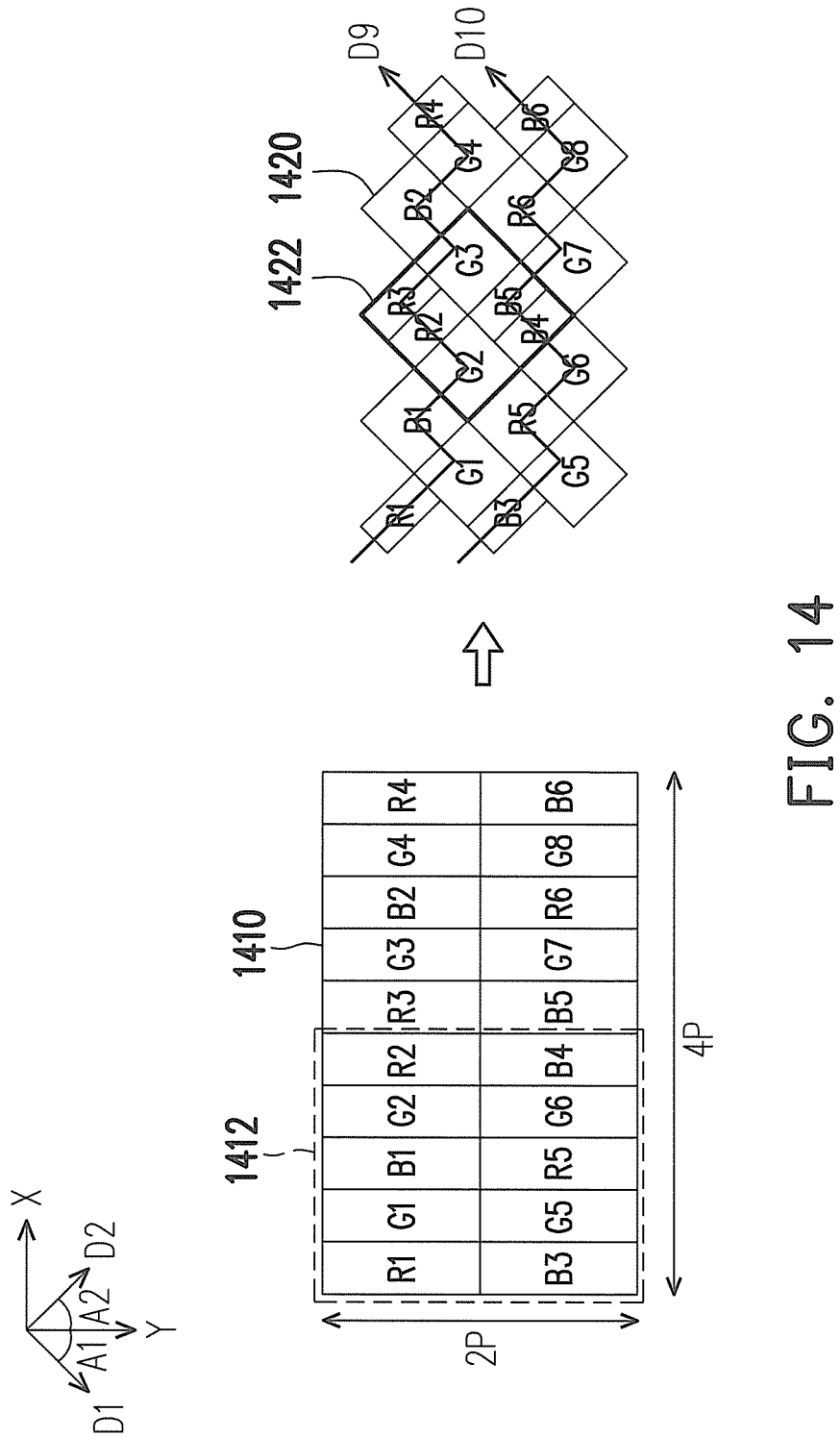
FIG. 14 and FIG. 15 are schematic diagrams respectively illustrating a top view of a sub-pixel arrangement structure corresponding to a pixel array according to an embodiment of the invention.
Figure 15:
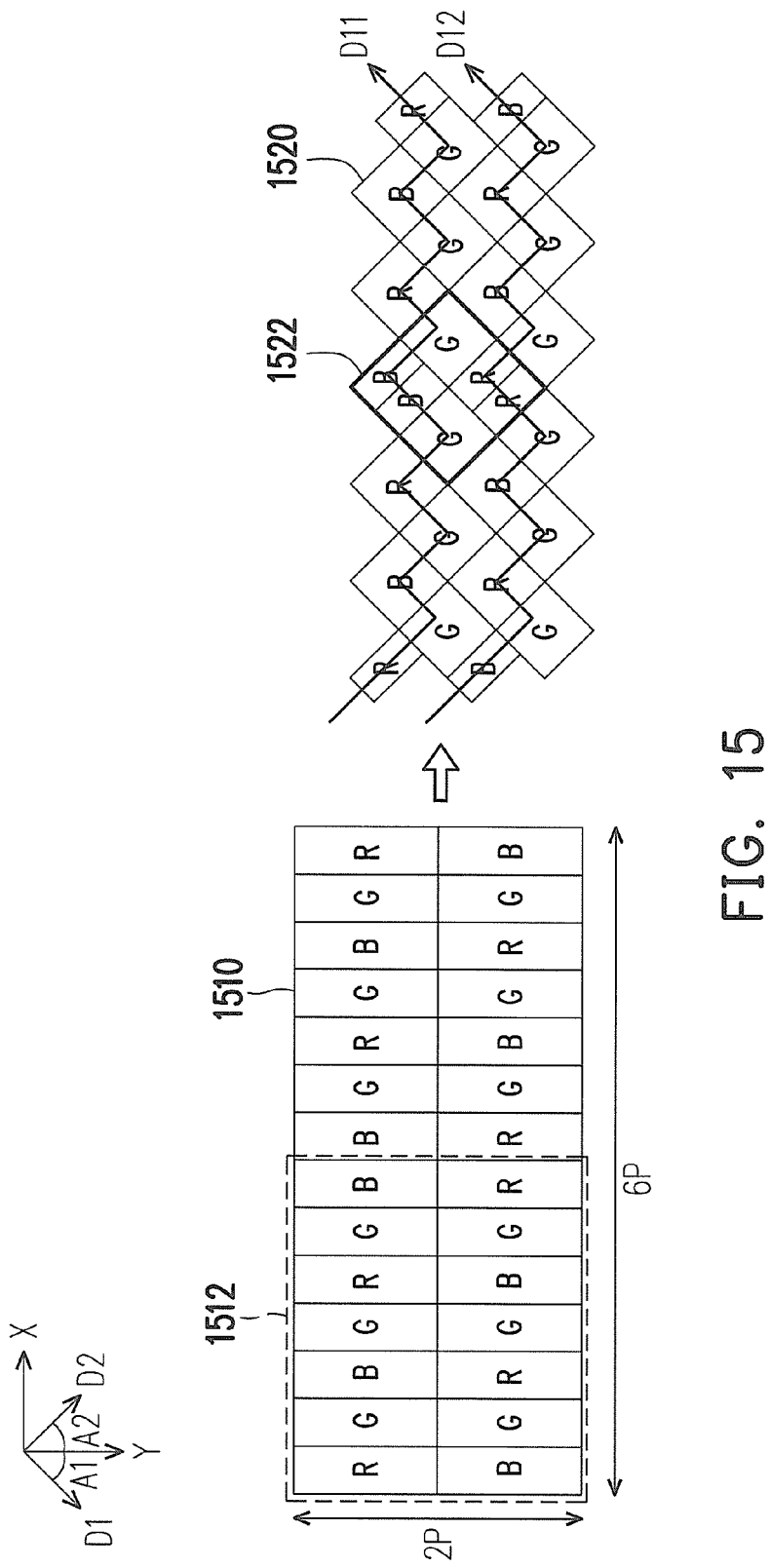

In some embodiments, columns of extra sub-pixels may be add into the sub-pixel arrangement structure for providing color mixing with adjacent columns to improve display quality. FIG. 14 and FIG. 15 are schematic diagrams respectively illustrating a top view of a sub-pixel arrangement structure corresponding to a pixel array according to an embodiment of the invention.

Referring to FIG. 1 and FIG. 14 at first, in this embodiment, a pixel array 1410 may be part or all of pixel array on the display panel 120, and a pixel group 1412 is arranged repeatedly to form the pixel array 1410. The pixel group 1412 may include a column of extra sub-pixels R2 and B4, which are respectively adjacent with sub-pixels R3 and B5 of another pixel group next to the pixel group 1412. As for a sub-pixel arrangement structure 1420, the sub-pixels in the sub-pixel arrangement structure 1420 may be arranged in the D1 direction and the D2 direction according to the arrangement of the pixel group 1412, where the D1 direction may be inclined at a first angle A1 relative to a reference direction (i.e. the Y direction), the D2 direction may be inclined at a second angle A2 relative to a reference direction (i.e. the Y direction), and a summation of the first angle A1 and the second angle A2 may be larger than or substantially equal to 90 degrees. Besides, the scan lines the OLED display 100 may be arranged in the reference direction (i.e. the Y direction).

Specifically, In the sub-pixel arrangement structure 1420, a first sequence along an arrangement path D9 includes the red sub-pixel R1, the green sub-pixel G1, the blue sub-pixel B1, the green sub-pixel G2, the red sub-pixel R2, the red sub-pixel R3, the green sub-pixel G3, the blue sub-pixel B2, the green sub-pixel G4 and the red sub-pixel R4, and a second sequence along an arrangement path D10 includes the blue sub-pixel B3, the green sub-pixel G5, the red sub-pixel R5, the green sub-pixel G6, the blue sub-pixel B4, the blue sub-pixel B5, the green sub-pixel G7, the red sub-pixel R6, the green sub-pixel G8 and the blue sub-pixel B6. Herein, the arrangement path D9 and D10 are paths composed of the D1 direction and the D2 direction. Similarly, the first sequence is similar to the arranging order of color pixels in the upper row of the pixel group 1410 in the X direction, and the second sequence is similar to the arranging order of color pixels in the lower row of the pixel group 1410 in the X direction.

In the present embodiment, the plurality of sub-pixels may include a sub-pixel group having six sub-pixels, where the six sub-pixels form a virtual quadrangle and include at least two sub-pixels having a same color. The at least two sub-pixels having the same color are arranged at one vertex of the virtual quadrangle. In addition, the at least two sub-pixels of the six sub-pixels have a same size smaller than sizes of rest sub-pixels of the six sub-pixels. Further, shapes of the at least two sub-pixels of the six sub-pixels are rectangle or parallelogram, and shapes of rest sub-pixels of the six sub-pixels are square or diamond.

More specifically, a virtual quadrangle 1422 in this embodiment may be formed by six sub-pixels the red sub-pixels R2, R3, the green sub-pixel G3, the blue sub-pixels B4, B5 and the green sub-pixel G2. The sub-pixels R2 and R3, which have the same color of red, are arranged at the upper vertex of the virtual quadrangle 1422, and the sub-pixels B4 and B5, which have the same color of blue, are arranged at the lower vertex of the virtual quadrangle 1422. Besides, the two sub-pixels G2 and G3, which have the same color of green, are separately arranged at other vertexes (for example, left vertex and right vertex) of the virtual quadrangle 1422.

It is worth mentioning that the red sub-pixels R2 and R3 having a same size, and the blue sub-pixels B4 and B5 are also having the same size, where the said size is smaller than sizes of rest sub-pixels (i.e. the green sub-pixels G2 and G3) of the six sub-pixels of the virtual quadrangle 1422. Besides, shapes of the red sub-pixels R2, R3 and the blue sub-pixels B4 and B5 are rectangle, and shapes of rest sub-pixels of the six sub-pixels, that is, the green sub-pixels G2 and G3, are square. In other embodiments, shapes of the red sub-pixels R2, R3 and the blue sub-pixels B4 and B5 may be rectangle or parallelogram, and shapes of rest sub-pixels of the six sub-pixels may be square or diamond. The invention in not intended to limit the shapes of the sub-pixels.

It should be also noted that the at least two sub-pixels may be driven by a single driver or by two separate drivers. In one embodiment, the display driver 110 is configured to drive all the sub-pixels of the sub-pixel arrangement structure 1420 (i.e. all the color pixels of the pixel group 1410). In other embodiments, the display driver 110 may include a first driver and a second driver. The first driver may be used for driving the left part of the pixel array 1410 (i.e. the pixel group 1412), which corresponds to the left part of the sub-pixel arrangement structure 1420, and the second driver may be used for driving the right part of the pixel array 1410, which corresponds to the right part of the sub-pixel arrangement structure 1420. Accordingly, the sub-pixels R2 and R3 in this embodiment may be driven by the first driver and the second driver separately, and a break point may be formed between the sub-pixels R2 and R3. Similarly, the sub-pixels B4 and B5 may be also driven by the first driver and the second driver separately, and another break point may be formed between the sub-pixels B4 and B5. Hence, needs of data transferring between each of the driving circuits may be avoided, thereby effectively simplifying the design of the display driver 110.

FIG. 15 illustrates another sub-pixel arrangement structure 1520 corresponding to a pixel array 1510 with extra sub-pixels included in a pixel group 1512. Similarly, the sub-pixels in the sub-pixel arrangement structure 1520 may be arranged in the D1 direction and the D2 direction according to the arrangement of the pixel group 1512.

Specifically, In the sub-pixel arrangement structure 1520, a first sequence along an arrangement path D11 includes the red sub-pixel R, the green sub-pixel G, the blue sub-pixel B, the green sub-pixel G, the red sub-pixel R, the green sub-pixel G, the blue sub-pixel B, the blue sub-pixel B, the green sub-pixel G, the red sub-pixel R, the green sub-pixel G, the blue sub-pixel B, the green sub-pixel G and the red sub-pixel R, and a second sequence along an arrangement path D12 includes the blue sub-pixel B, the green sub-pixel G, the red sub-pixel R, the green sub-pixel G, the blue sub-pixel B, the green sub-pixel G, the red sub-pixel R the red sub-pixel R, the green sub-pixel G, the blue sub-pixel B, the green sub-pixel G, the red sub-pixel R, the green sub-pixel G and the blue sub-pixel B. Herein, the arrangement path D11 and D12 are paths composed of the D1 direction and the D2 direction. Similarly, the first sequence is similar to the arranging order of color pixels in the upper row of the pixel group 1510 in the X direction, and the second sequence is similar to the arranging order of color pixels in the lower row of the pixel group 1510 in the X direction.

Particularly, a virtual quadrangle 1522 may be formed by six sub-pixels, including two blue sub-pixels arranged at the upper vertex of the virtual quadrangle 1522, two red sub-pixels arranged at the lower vertex of the virtual quadrangle 1522, and two green sub-pixels separately arranged at other vertexes of the virtual quadrangle 1522. Similarly, for the case that the display driver 110 may include two separate drivers, the two blue sub-pixels arranged at the upper vertex of the virtual quadrangle 1522 may be driven by two drivers separately, and the two red sub-pixels arranged at the lower vertex of the virtual quadrangle 1522 may be driven by two drivers separately. This embodiment is similar to the aforementioned embodiment. Therefore, details of the same or similar elements are not repeated hereinafter.

To conclude the above, the sub-pixel arrangement structures of the OLED display according to the embodiments of the invention adaptively configure the sub-pixels of the same color to be adjacent, with the shapes of the sub-pixels being square or diamond, so as to effectively enlarge the emission area. Embodiments of arranging sub-pixels of one color adjacent and embodiments of arranging sub-pixels of all colors adjacent separately are both provided. In addition, the embodiments of the invention are also capable of applying for the design with extra sub-pixels for color mixing. Accordingly, fabrication limitations may be overcome, the light transmittance and the aperture ratio may be enhanced, and thereby a good display quality with extending lifetime of the OLED display may be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sub-pixel arrangement structure of an organic light emitting diode display comprising:
   a plurality of sub-pixels arranged in a first direction and a second direction to form a sub-pixel array, wherein the first direction is inclined at a first angle relative to a reference direction, and the second direction is inclined at a second angle relative to the reference direction, wherein shapes of the plurality of sub-pixels are quadrangles,
   wherein each four sub-pixels of the plurality of sub-pixels form a virtual quadrangle, the each four sub-pixels comprise two sub-pixels having a same color, and the two sub-pixels having the same color are arranged at adjacent vertexes of the virtual quadrangle in one of the first direction and the second direction, and
   wherein the each four sub-pixels is formed by sub-pixels of three color types, and the virtual quadrangle consists of the each four sub-pixels, wherein two sides of any one of the each four sub-pixels are connected to another two of the each four sub-pixels.

2. The sub-pixel arrangement structure of the OLED display as claimed in claim 1, wherein the virtual quadrangles comprise a first virtual quadrangle and a second virtual quadrangle adjacently arranged in the reference direction, a color arrangement of the sub-pixels of the first virtual quadrangle that rotates by 180 degrees is identical to a color arrangement of the sub-pixels of the second virtual quadrangle.

3. The sub-pixel arrangement structure of the OLED display as claimed in claim 2, wherein the virtual quadrangles comprise a third virtual quadrangle adjacently arranged to the first virtual quadrangle in a third direction, and the third direction is perpendicular to the reference direction, wherein the color arrangement of the sub-pixels of the first virtual quadrangle that rotates by 180 degrees is identical to a color arrangement of the sub-pixels of the third virtual quadrangle.

4. The sub-pixel arrangement structure of the OLED display as claimed in claim 1, wherein the virtual quadrangles comprise a first virtual quadrangle and a second virtual quadrangle adjacently arranged in the reference direction, a color arrangement of the sub-pixels of the first virtual quadrangle that is mirrored with respect to the one of the first direction and the second direction is identical to a color arrangement of the sub-pixels of the second virtual quadrangle.

5. The sub-pixel arrangement structure of the OLED display as claimed in claim 4, wherein the virtual quadrangles comprise a third virtual quadrangle adjacently arranged to the first virtual quadrangle in a third direction, and the third direction is perpendicular to the reference direction, wherein the color arrangement of the sub-pixels of the first virtual quadrangle that is mirrored with respect to the one of the first direction and the second direction is identical to a color arrangement of the sub-pixels of the third virtual quadrangle.

6. The sub-pixel arrangement structure of the OLED display as claimed in claim 1, wherein the virtual quadrangles comprise a first virtual quadrangle, a second virtual quadrangle and a third virtual quadrangle adjacently and sequentially arranged in a third direction, and the third direction is perpendicular to the reference direction, and two sub-pixels of the first virtual quadrangle have a same first color, two sub-pixels of the second virtual quadrangle have a same second color, and two sub-pixels of the third virtual quadrangle have a same third color, wherein the first color, the second color, and the third color are distinct from one another.

7. The sub-pixel arrangement structure of the OLED display as claimed in claim 1, wherein a summation of the first angle and the second angle is larger than or substantially equal to 90 degrees.

8. The sub-pixel arrangement structure of the OLED display as claimed in claim 1, wherein the OLED display comprises scan lines, and the scan lines are arranged in the reference direction.

9. The sub-pixel arrangement structure of the OLED display as claimed in claim 1, wherein the plurality of sub-pixels have a same size.

10. The sub-pixel arrangement structure of the OLED display as claimed in claim 1, wherein the shapes of the plurality of sub-pixels are square or diamond.

11. The sub-pixel arrangement structure of the OLED display as claimed in claim 1, wherein the each four sub-pixels comprise red, green and blue sub-pixels, and the two sub-pixels having the same color are the red, the green or the blue sub-pixels.

12. A sub-pixel arrangement structure of an organic light emitting diode display comprising:
  a plurality of sub-pixels arranged in a first direction and a second direction to form a sub-pixel array, wherein the first direction is inclined at a first angle relative to a reference direction, and the second direction is inclined at a second angle relative to the reference direction, wherein shapes of the plurality of sub-pixels are quadrangles,
  wherein the plurality of sub-pixels comprise a sub-pixel group having six sub-pixels, the six sub-pixels form a virtual quadrangle and comprise at least two sub-pixels having a same color, and the at least two sub-pixels having the same color are arranged at one vertex of the virtual quadrangle, and
  wherein the sub-pixel group is formed by sub-pixels of three color types, and the virtual quadrangle consists of the six sub-pixels, wherein at least two sides of any one of the six sub-pixels are connected to at least another two of the six sub-pixels.

13. The sub-pixel arrangement structure of the OLED display as claimed in claim 12, wherein the at least two sub-pixels comprise two first sub-pixels and two second sub-pixels, the two first sub-pixels are arranged at the one vertex of the virtual quadrangle and have a same first color, and the two second sub-pixels are arranged at another vertex of the virtual quadrangle and have a same second color.

14. The sub-pixel arrangement structure of the OLED display as claimed in claim 13, wherein the six sub-pixels further comprise two third sub-pixels have a same third color, and the two third sub-pixels are separately arranged at other vertexes of the virtual quadrangle.

15. The sub-pixel arrangement structure of the OLED display as claimed in claim 14, wherein the first color is selected from one of red, green and blue, the second color is selected from another one of red, green and blue, and the third color is selected from yet another one of red, green and blue.

16. The sub-pixel arrangement structure of the OLED display as claimed in claim 12, wherein a summation of the first angle and the second angle is larger than or substantially equal to 90 degrees.

17. The sub-pixel arrangement structure of the OLED display as claimed in claim 12, wherein the OLED display comprises scan lines, and the scan lines are arranged in the reference direction.

18. The sub-pixel arrangement structure of the OLED display as claimed in claim 12, wherein the at least two sub-pixels of the six sub-pixels have a same size smaller than sizes of rest sub-pixels of the six sub-pixels.

19. The sub-pixel arrangement structure of the OLED display as claimed in claim 12, wherein shapes of the at least two sub-pixels of the six sub-pixels are rectangle or parallelogram, and shapes of rest sub-pixels of the six sub-pixels are square or diamond.

20. The sub-pixel arrangement structure of the OLED display as claimed in claim 12, wherein the at least two sub-pixels are driven by a single driver or by two separate drivers.

* * * * *